United States Patent
Lee et al.

(10) Patent No.: US 11,830,785 B2
(45) Date of Patent: Nov. 28, 2023

(54) PACKAGE WITH WINDOWED HEAT SPREADER

(71) Applicant: STATS ChipPAC Pte. Ltd., Singapore (SG)

(72) Inventors: TaeKeun Lee, Incheon (KR); Youngmin Kim, Incheon (KR); Yongmin Kim, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 83 days.

(21) Appl. No.: 17/450,146

(22) Filed: Oct. 6, 2021

(65) Prior Publication Data

US 2023/0118190 A1 Apr. 20, 2023

(51) Int. Cl.
*H01L 23/367* (2006.01)
*H01L 25/065* (2023.01)
*H01L 25/10* (2006.01)
*H01L 25/00* (2006.01)

(52) U.S. Cl.
CPC ...... *H01L 23/3675* (2013.01); *H01L 25/0655* (2013.01); *H01L 25/105* (2013.01); *H01L 25/50* (2013.01)

(58) Field of Classification Search
CPC .......... H01L 23/3675; H01L 25/0655; H01L 25/105; H01L 25/50
See application file for complete search history.

(56) References Cited

U.S. PATENT DOCUMENTS

| | | | | |
|---|---|---|---|---|
| 6,117,352 A | * | 9/2000 | Weaver | G01R 31/2886 216/106 |
| 7,944,046 B2 | | 5/2011 | Chao | |
| 10,541,216 B2 | | 1/2020 | Nakagawa et al. | |
| 10,804,205 B1 | * | 10/2020 | Lin | H01L 23/5383 |
| 11,282,762 B2 | * | 3/2022 | Kao | H01L 23/367 |
| 2008/0116586 A1 | * | 5/2008 | Kim | H01L 23/42 257/E23.101 |
| 2017/0053853 A1 | * | 2/2017 | Refai-Ahmed | H01L 21/4882 |
| 2020/0006303 A1 | | 1/2020 | Akiba et al. | |
| 2021/0259134 A1 | * | 8/2021 | Uppal | H01L 23/10 |
| 2021/0327782 A1 | * | 10/2021 | Han | H01L 23/3675 |
| 2022/0336318 A1 | * | 10/2022 | Lin | H01L 23/31 |

FOREIGN PATENT DOCUMENTS

JP 2007243106 A * 9/2007
JP 2007258448 A * 10/2007

* cited by examiner

*Primary Examiner* — Michael Lebentritt
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a first semiconductor die disposed over the substrate. A subpackage is also disposed over the substrate. A stiffener is disposed over the substrate around the first semiconductor die and subpackage. A heat spreader is disposed over the stiffener. The heat spreader is thermally coupled to the first semiconductor die. The heat spreader has an opening over the subpackage.

21 Claims, 13 Drawing Sheets

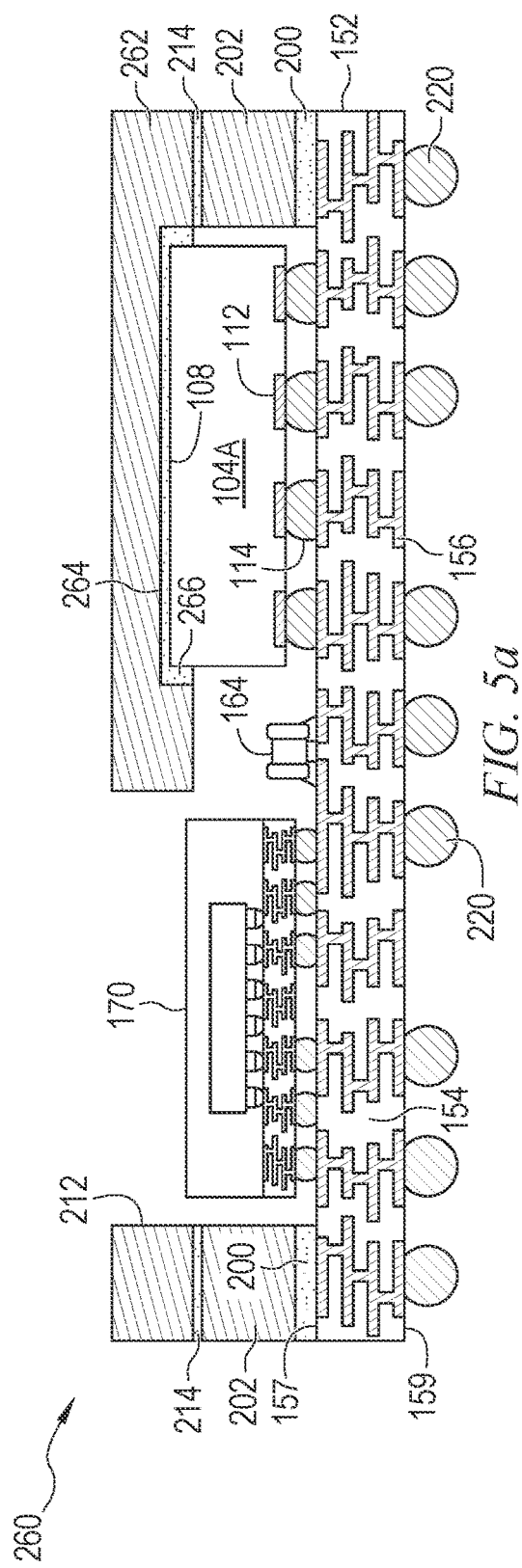
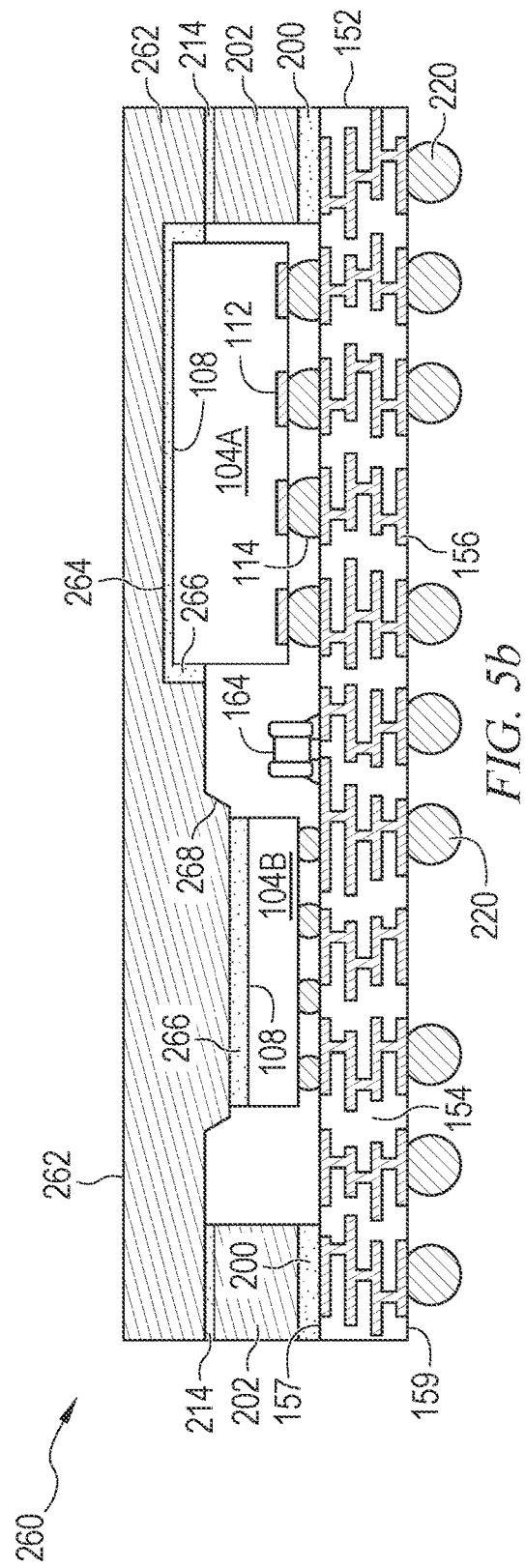
FIG. 5a
FIG. 5b

PACKAGE WITH WINDOWED HEAT SPREADER

FIELD OF THE INVENTION

The present invention relates in general to semiconductor devices and, more particularly, to a semiconductor device and method of forming a semiconductor device with a windowed heat spreader.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

As devices are reduced in size, and operate at higher frequencies, heat generation of the semiconductor components becomes more of a design consideration. Many semiconductor packages include heat spreaders connected to semiconductor die. The heat spreaders help dissipate heat from the semiconductor die by spreading out the thermal energy over a larger surface area. The heat spreaders also improve thermal handling capacity by allowing an external heat sink to be attached via the heat spreader.

Heat spreaders are typically a separate component disposed over a semiconductor die or package. The heat spreaders commonly form part of an enclosure that extends around and over components of the semiconductor package. One problem with prior art heat spreaders is that the enclosure can trap thermal energy within the package and cause problems with thermal management of other enclosed components. Therefore, a need exists for an improved heat spreader for semiconductor packages.

BRIEF DESCRIPTION OF THE DRAWINGS

FIGS. 5a-5c illustrate embodiments adapted to packages and semiconductor die with differing heights;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
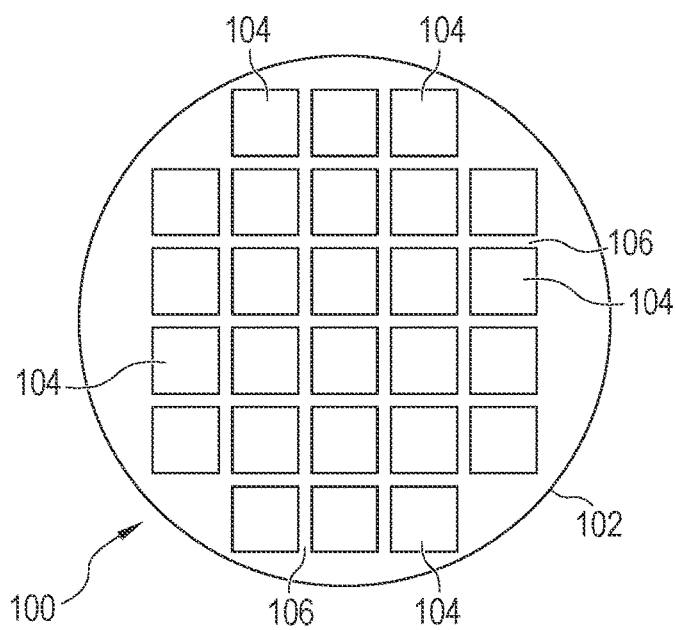
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
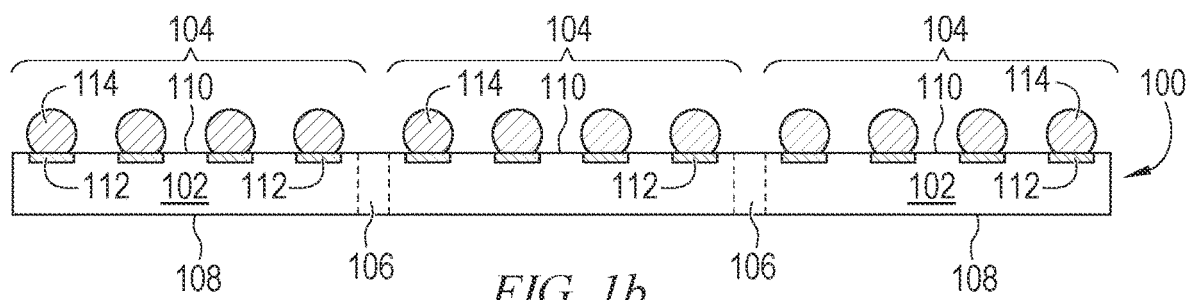

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layer 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, or other electrical interconnect.

Figure 1C:
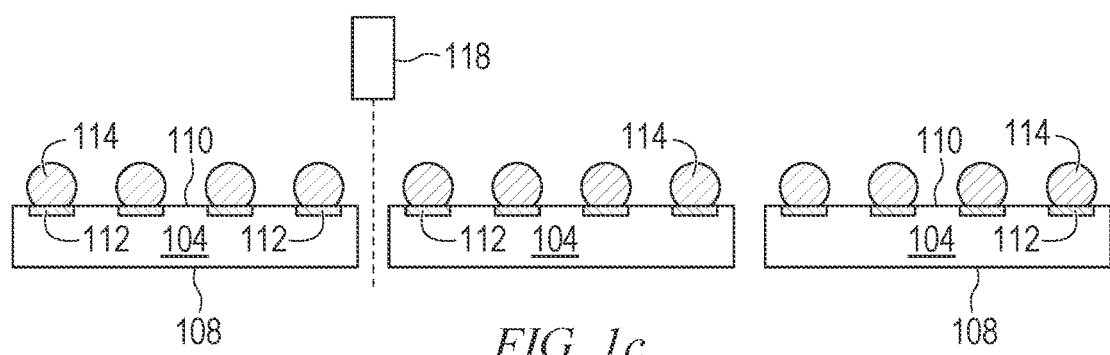

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2A:
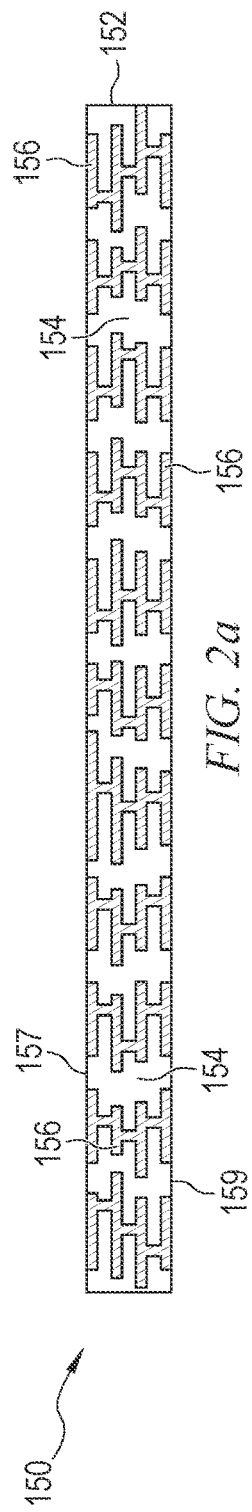
FIGS. 2a-2h illustrate forming a semiconductor package with a windowed heat spreader.

FIGS. 2a-2h illustrate forming semiconductor packages 150 with semiconductor die 104 and a windowed heat spreader. FIG. 2a is a partial cross-sectional view of a substrate 152 used as a base for manufacturing packages 150. Substrate 152 can be a unit substrate singulated from a larger panel or remain as part of a larger substrate panel. Hundreds or thousands of packages are commonly formed in a single substrate panel or on separate unit substrates on a single carrier using the same steps described herein.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled vertically through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Figure 2B:
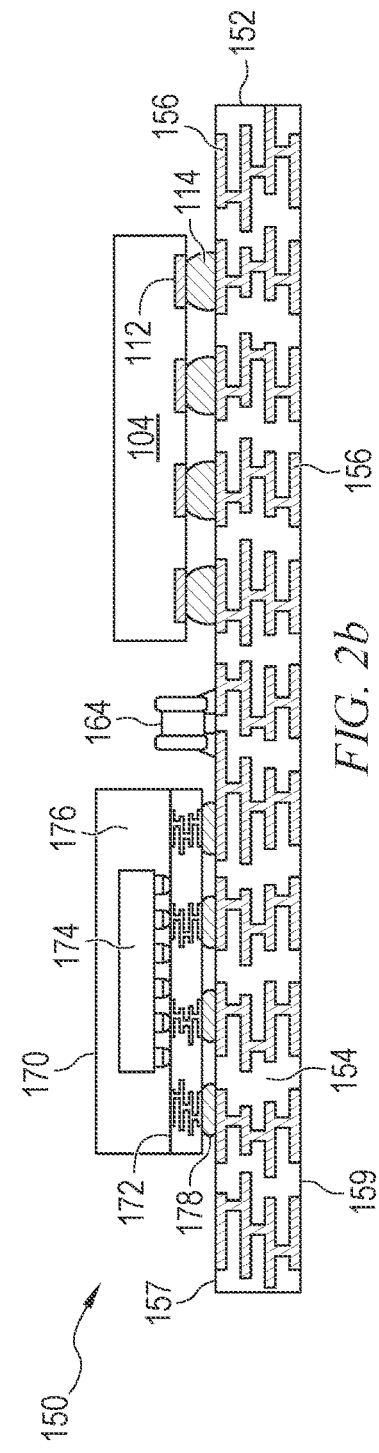

Any components desired to implement the intended functionality of packages 150 are mounted to or disposed over substrate 152 and electrically connected to conductive layers 156. Substrate 152 has two major surfaces: top surface 157 and bottom surface 159. Components can be mounted onto top surface 157 and bottom surface 159 in any suitable configuration. In FIG. 2b, manufacturing of package 150 on substrate 152 commences with surface mounting of semiconductor die 104, discrete component 164, and subpackage 170 on top surface 157 using, e.g., any suitable pick and place method or device.

Semiconductor die 104 represents any one or more electrical components that are to be thermally connected or coupled to an overlying heat spreader in subsequent manufacturing steps for thermal management. Subpackage 170 and discrete components 164 represent components that do not need to be directly coupled to a heat spreader. Subpackage 170 can be any suitable package of any suitable type or configuration. Subpackage 170 can also be a bare die similar to semiconductor die 104, or only discrete components 164 can be used without a separate subpackage 170.

The illustrated subpackage 170 includes a substrate 172 similar to substrate 152, a die 174 similar to die 104, an encapsulant 176, and solder bumps 178 similar to bumps 114. Additional die, subpackages, or discrete components can be mounted on top surface 157 or 159 as desired to implement the intended functionality of package 150. Discrete components 164, e.g., resistors, capacitors, inductors, transistors, or diodes, are mounted on top surface 157 using solder paste or another suitable attachment and connection mechanism. Solder paste is reflowed between terminals of discrete components 164 and contact pads of conductive layers 156 on top surface 157. Bumps 114 and 178 are reflowed, typically in the same process step, to physically and electrically connect die 104 and subpackage 170, respectively, to substrate 152.

Figure 2C:
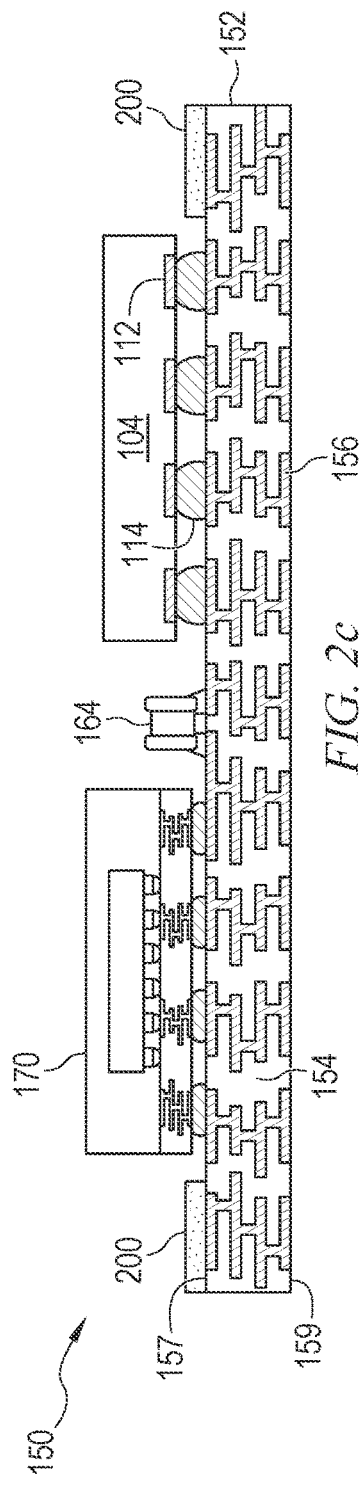

In FIG. 2c, an adhesive layer 200 is disposed on top surface 157. Adhesive 200 is dispensed in a ring completely around the perimeter of substrate 152 using a nozzle in one embodiment. In other embodiments, adhesive 200 is discontinuous around the perimeter of substrate 152.

Figure 2D:
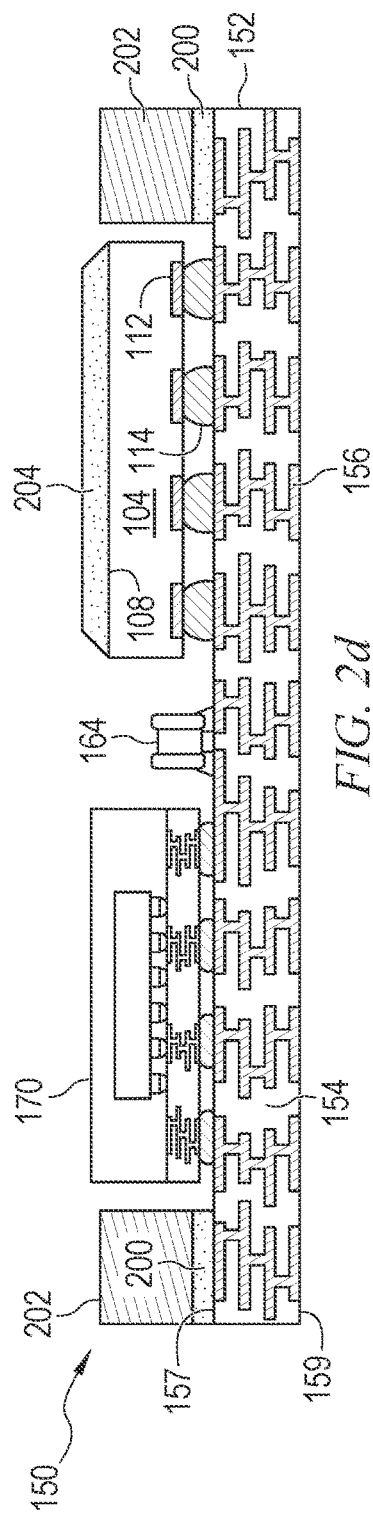
Figure 2E:
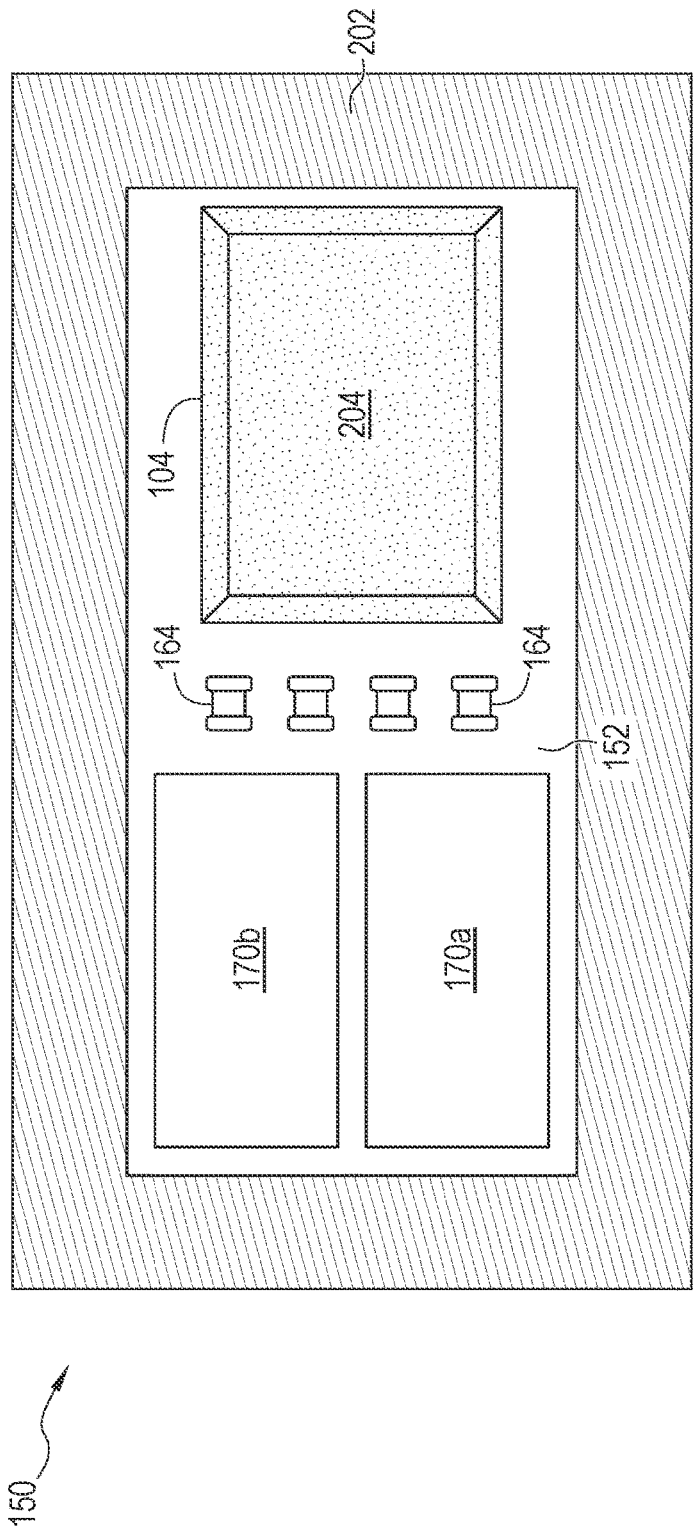

Adhesive 200 is used to attach a stiffener ring 202 to substrate 152 in FIGS. 2d and 2e. Stiffener ring 202 forms a ring around semiconductor die 104, subpackage 170, and discrete component 168. In the illustrated embodiment, stiffener ring 202 extends completely to all edges of substrate 152 and continuously around the perimeter of the substrate. In other embodiments, substrate 152 may extend outside the boundary of stiffener ring 202 and additional components may be disposed on the substrate outside of the stiffener ring boundary. Stiffener ring 202 sits directly on adhesive 200 and has approximately the same shape. In embodiments where stiffener ring 202 does not follow the perimeter of substrate 152, adhesive 200 is modified to follow the shape of the stiffener ring accordingly. Adhesive 200 fixes stiffener ring 202 to substrate 152. Stiffener ring 202 physically supports the final package to reduce warpage.

A thermal interface material (TIM) 204 is disposed on back surface 108 of semiconductor die 104. TIM 204 facilitates thermal transfer from semiconductor die 104 to the overlying heat spreader to be placed in the following manufacturing steps. TIM 204 can be applied in any suitable pattern and may not completely cover back surface 108.

FIG. 2e shows a plan view of stiffener ring 202 on substrate 152, revealing a plurality of discrete components 164 and a pair of subpackages 170a and 170b. Any suitable combination of components can be used. In one embodiment, subpackage 170a is the subpackage illustrated in the cross section of FIG. 2d while subpackage 170b is a bare die similar to die 104. The plan view shows how stiffener ring 202 extends completely around the components on substrate 152. Stiffener ring 202 may also be discontinuous.

Figure 2F:
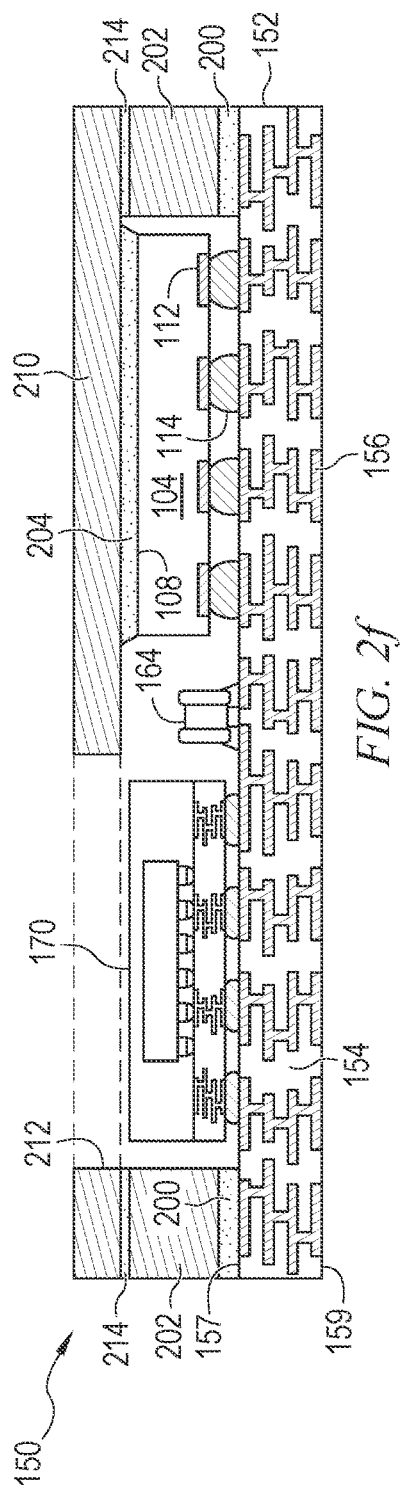
Figure 2G:
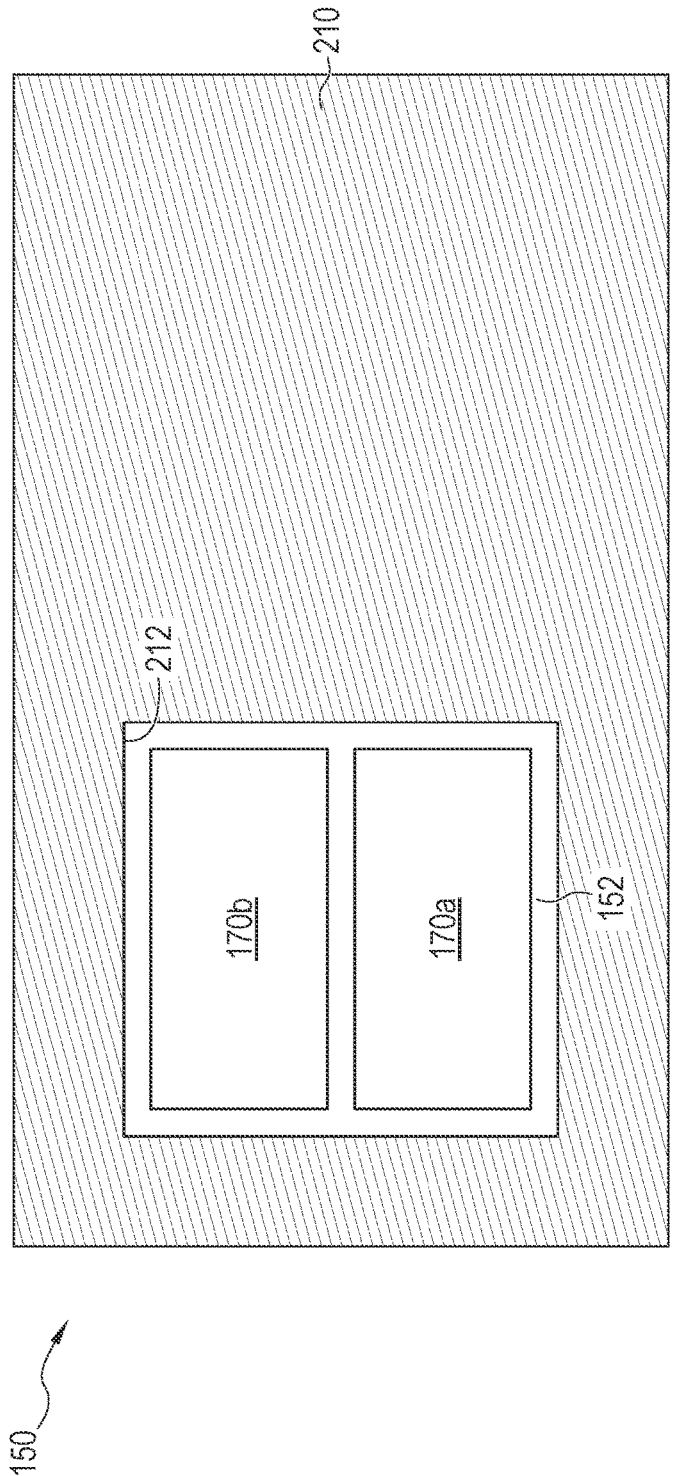

In FIGS. 2f and 2g, heat spreader 210 is disposed on stiffener ring 202. Heat spreader 210 is cut from a sheet of metal using mechanical or laser cutting or formed using any other suitable process. The material for heat spreader 210 is copper, steel, aluminum, titanium, carbon, mixtures thereof, alloys thereof, or any other suitable metal or nonmetal heat spreader material. Heat spreader 210 includes an outer perimeter that is approximately identical to the outer perimeter of ring 202. An adhesive 214 is disposed on heat spreader 210, stiffener ring 202, or both prior to disposing the heat spreader on the stiffener ring. Adhesive 214 mechanically fixes heat spreader 210 to stiffener ring 202. The height of stiffener ring 202 is selected such that a bottom surface of heat spreader 210 contacts and presses down on TIM 204.

TIM 204 is pressed into a thin layer by heat spreader 210. TIM 204 enhances thermal conductivity from semiconductor die 104 to heat spreader 210. In general, heat spreader 210 will be pressed down until the heat spread physically contacts semiconductor die 104. TIM 204 fills in tiny gaps between heat spreader 210 and back surface 108 of semiconductor die 104 that exist due to asperities and other imperfections in the surfaces. All below embodiments also typically include their respective heat spreaders in physical contact with their respective die or other electrical components being cooled.

Heat spreader 210 includes a window 212 formed as an opening completely through the heat spreader over subpackages 170. FIG. 2g shows a plan view with subpackages 170a and 170b contained completely within the footprint of window 212. Having subpackages 170 completely within the footprint of window 212 allows the subpackages to be taller than would be normally allowed if heat spreader 210 completely filled in the area within stiffener ring 202. However, subpackages 170 can extend outside a footprint of window 212, under heat spreader 210, if the subpackages are shorter than stiffener ring 202. Heat spreader 210 extends over discrete components 168, but discrete components 168 could also be located within the footprint of window 212. Window 212 is formed in any suitable shape based primarily on the layout of underlying components that do not need to be in direct thermal contact with heat spreader 210.

Figure 2H:
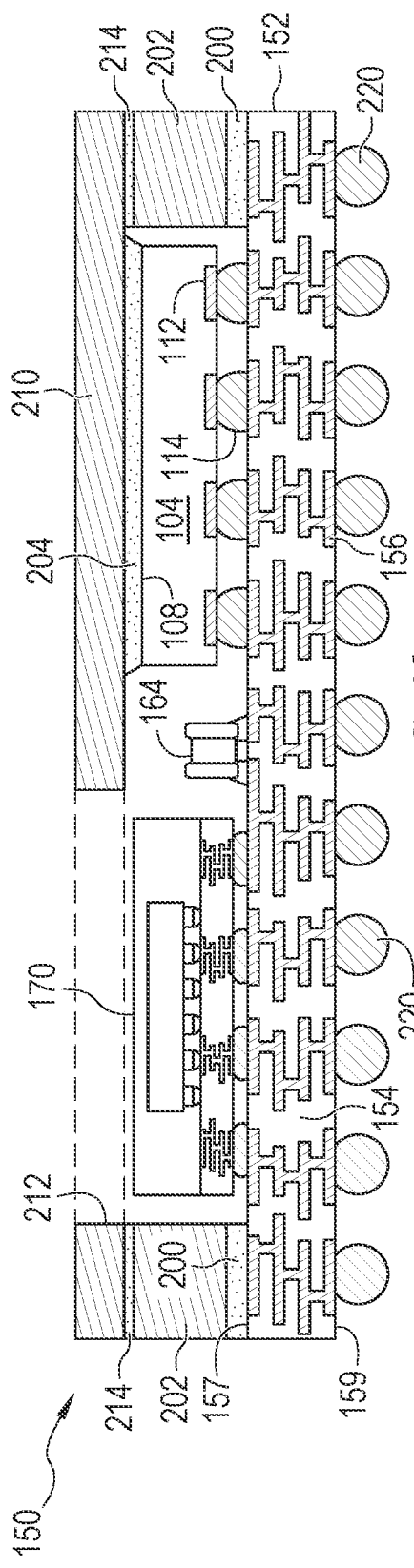

Package 150 is completed in FIG. 2h by applying solder bumps 220 to bottom surface 159 of substrate 152 in any suitable method, similar to the application of bumps 114 in FIG. 1B. Bumps 220 are subsequently used to install package 150 into a larger electrical system. In some embodiments, a plurality of packages 150 are formed as a panel and then singulated from each other after completion.

Semiconductor die 104 is thermally connected to heat spreader 210 by TIM 204, which allows thermal energy from the semiconductor die to be efficiently removed. A heatsink can later be attached to the top surface of heat spreader 210 opposite semiconductor die 104 to increase the exposed surface area and thereby the rate of thermal transfer to ambient. Opening 212 in heat spreader 210 allows thermal energy from subpackages 170 to escape package 150 to ambient. Subpackages 170 may not require thermal management via a heat spreader, but could still produce enough heat to cause malfunction if fully enclosed within a complete bubble formed between substrate 152, stiffener ring 202, and heat spreader 210 without window 212. Window 212 allows heat within package 150 to escape quicker than if heat spreader 210 fully enclosed the package. Any components that require a heat sink or heat spreader are placed under heat spreader 210 while components that do not need a heat spreader are placed under or near window 212 to allow convection out of package 150.

Figure 3:
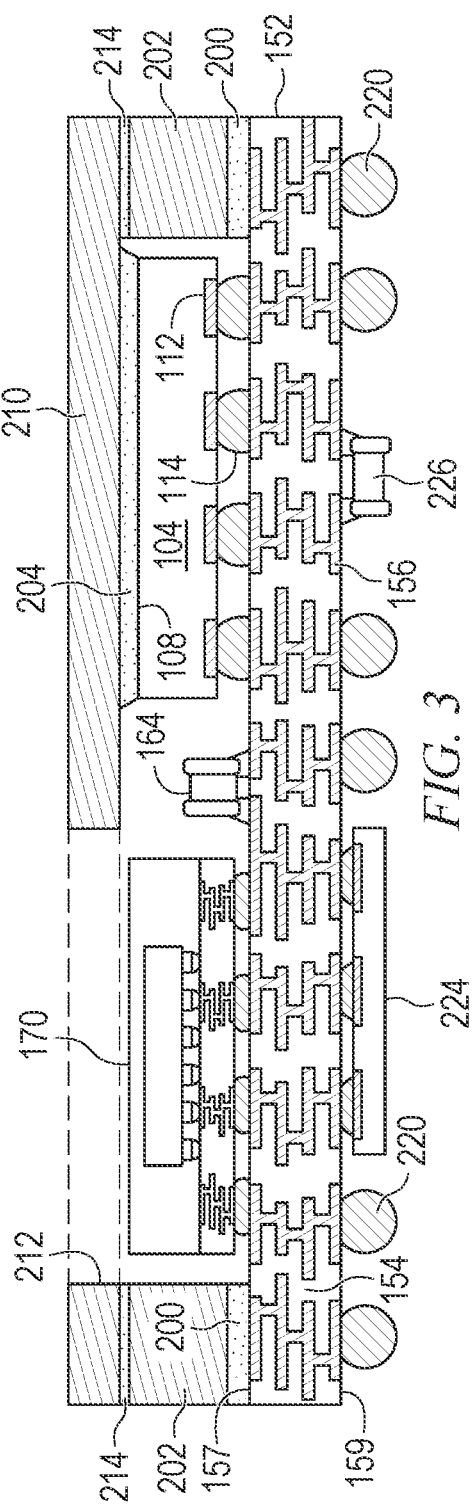
FIG. 3 illustrates a double-sided embodiment.

FIG. 3 shows a double-sided semiconductor package 222. Semiconductor package 222 is similar to package 150, with the primary difference being semiconductor die 224 and discrete component 226 disposed on bottom surface 159. Any combination of components, including active or passive discrete components, integrated circuits, and subpackages, can be mounted on bottom surface 159.

Figure 4A:
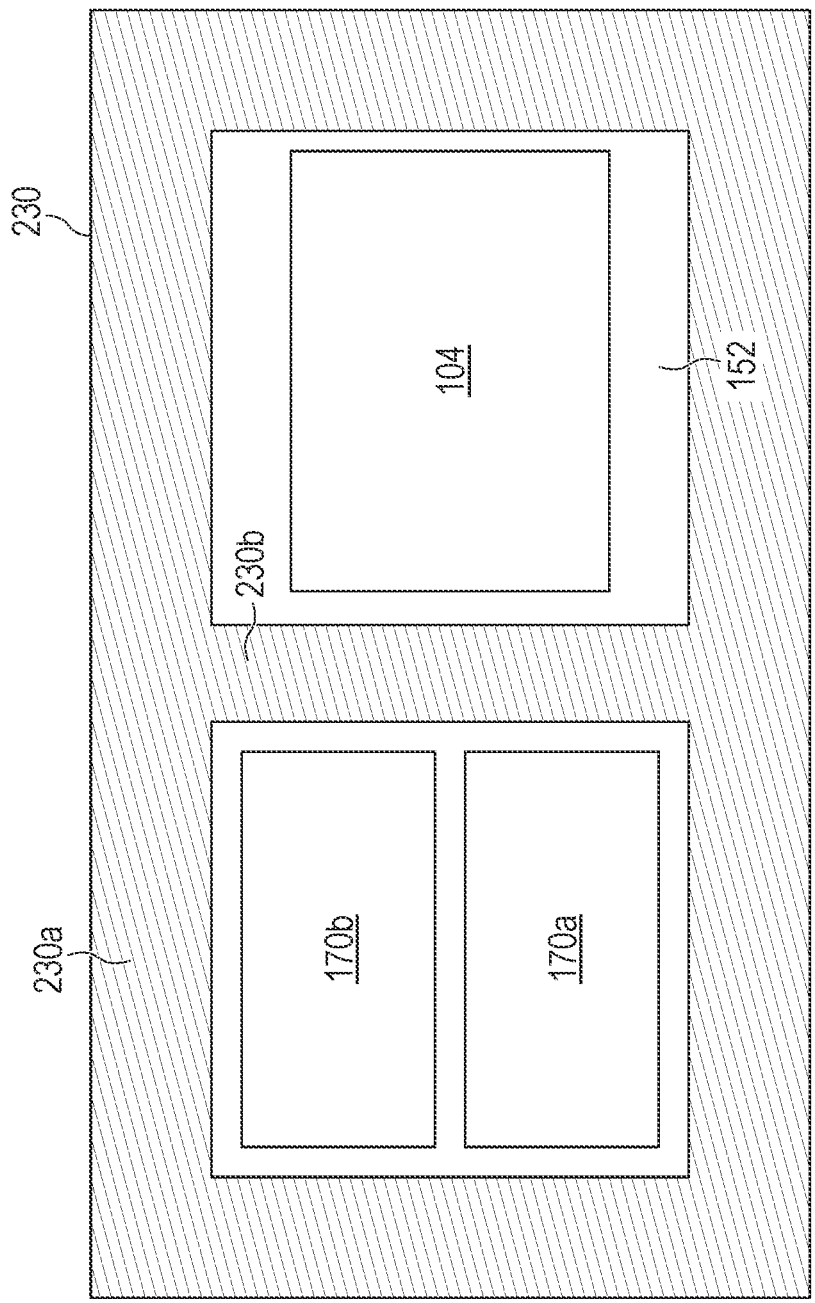
FIGS. 4a-4c illustrate embodiments with a compartmentalized stiffener.
Figure 4B:
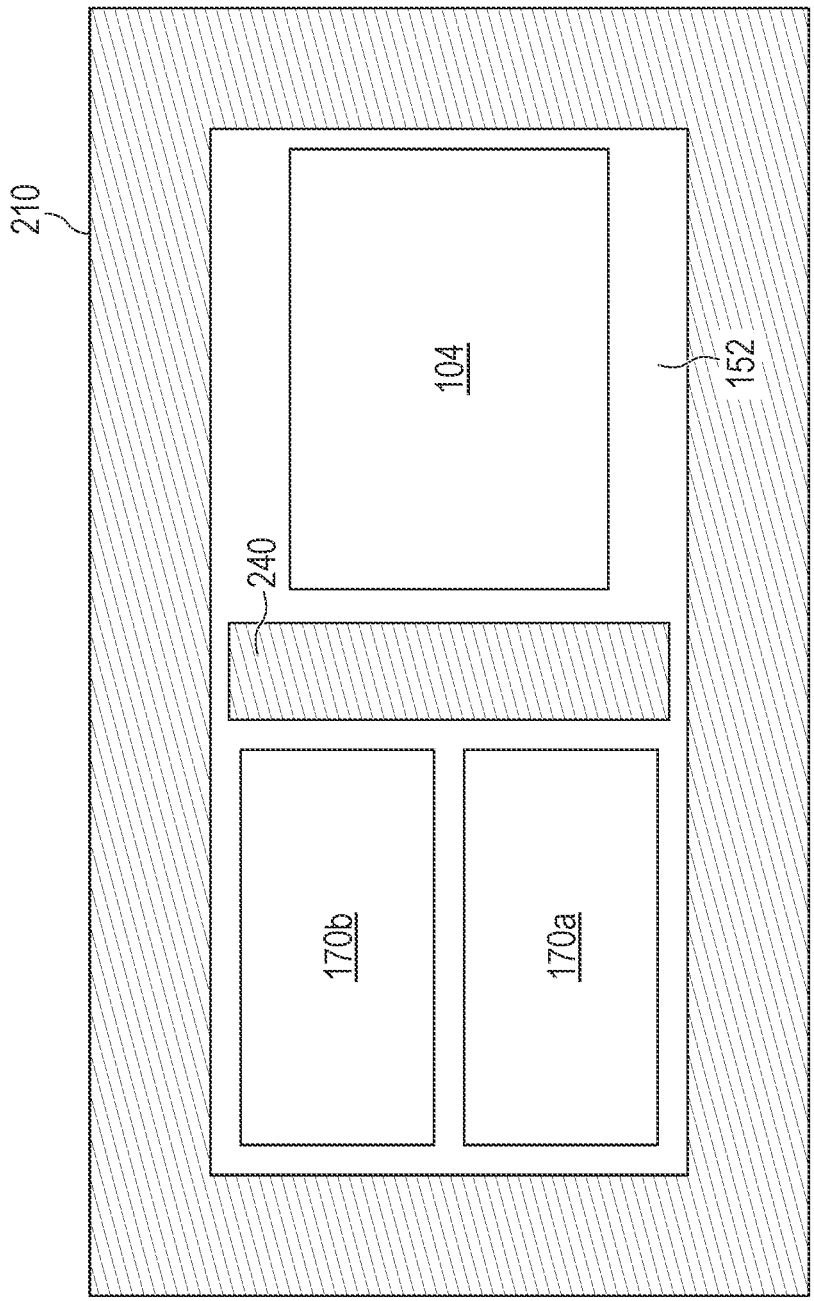
Figure 4C:
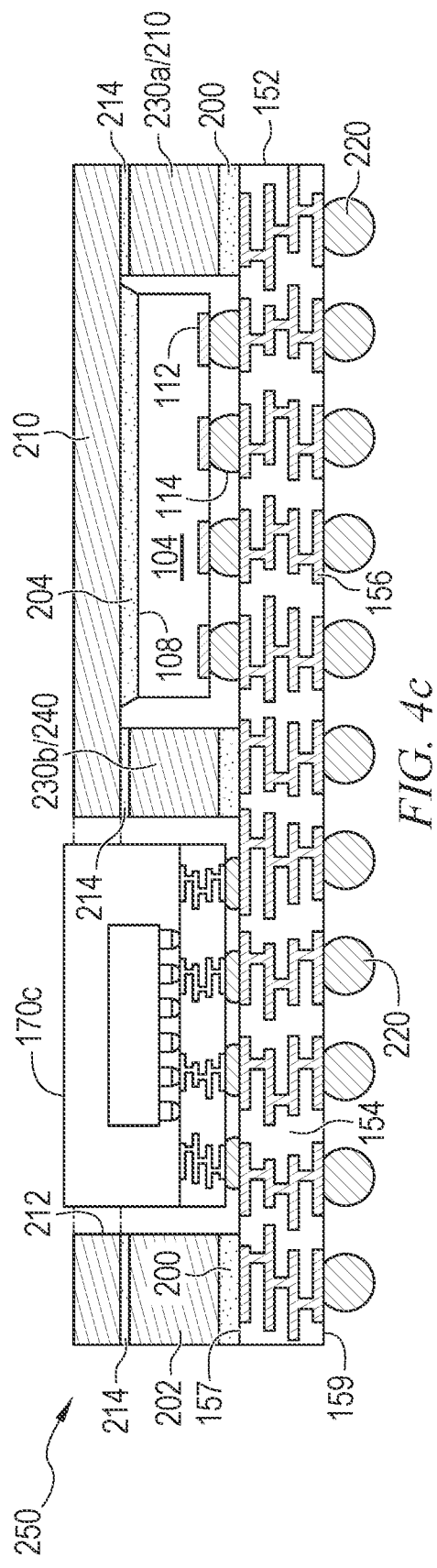

FIGS. 4a-4c illustrate embodiments where the stiffener ring includes a bar through the package to compartmentalize the electrical components. Stiffener 230 in FIG. 4a includes a ring stiffener 230a and compartment stiffener 230b formed together as a single continuous block of material. Compartment stiffener 230b creates two different compartments for the electrical components on substrate 152. Alternatively, a separate compartment stiffener 240 can be added in addition to ring stiffener 210 as shown in FIG. 4b.

A compartment stiffener helps further brace the resultant semiconductor packages against warpage and reduces the amount of heat from semiconductor die 104 that reaches subpackages 170 via radiation or convection. FIG. 4c shows a cross-section of a package 250 with a compartment stiffener. Both compartment stiffener 240 with ring stiffener 210 and stiffener 230 with compartment stiffener 230b built in have basically the same cross-sectional appearance other than in cross-sections where gaps exist between stiffeners 210 and 240. FIG. 4c also illustrates a taller subpackage 170c extending into window 212 and over the top surface of heat spreader 210 as an example. Any embodiment can include the taller subpackage 170c.

Figure 5C:
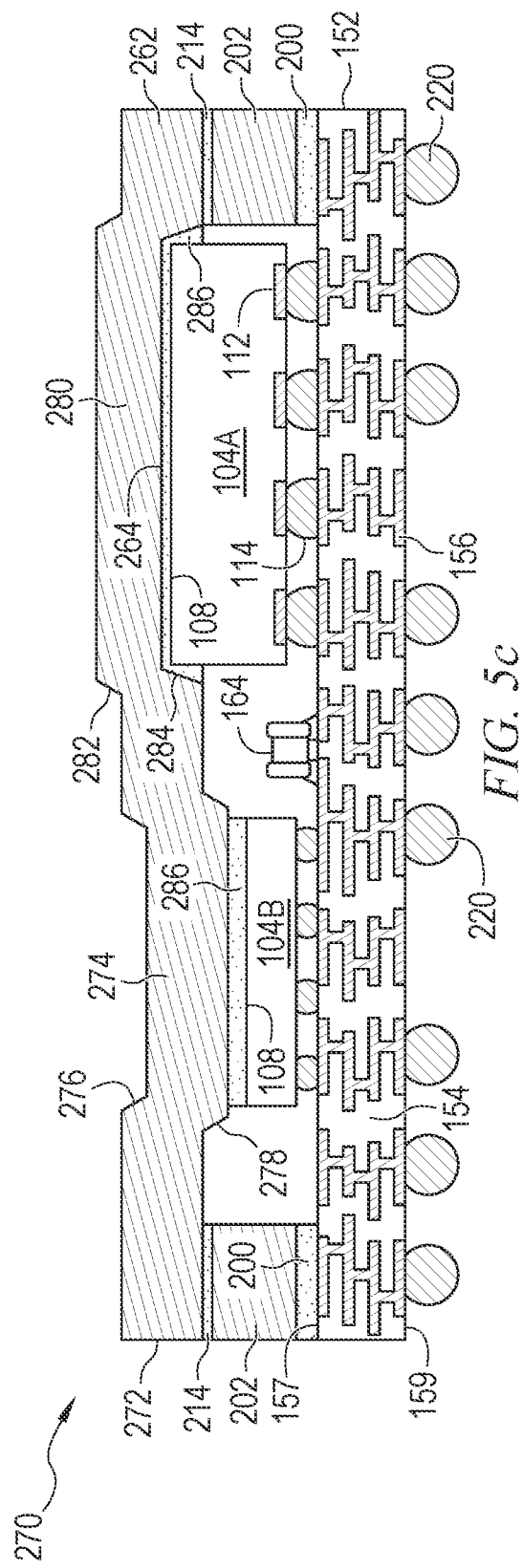

In some cases, a height of semiconductor die 104 is not suitable for a flat heat spreader disposed on a specific thickness of ring stiffener 202 that is available. FIGS. 5a-5c illustrate various embodiments to accommodate different heights of semiconductor die 104. In FIG. 5a, package 260 includes a semiconductor die 104a that is taller than ring stiffener 202, and therefore heat spreader 210 would be unable to lie flat on the ring stiffener.

Accordingly, a heat spreader 262 with a cavity 264 formed into the bottom surface of the heat spreader is used. Cavity 264 has a depth into heat spreader 262 approximately equal to, or slightly larger than, the height differential between semiconductor die 104a and ring stiffener 202. When heat spreader 262 is laid down on ring stiffener 202, there is a slight gap between the horizontal surface of cavity 264 and back surface 108 of semiconductor die 104a to accommodate TIM 266.

FIG. 5b shows another cross-sectional view of the same package 260. The cross-section of FIG. 5b only extends through heat spreader 262 and not through window 212. Two semiconductor die 104a and 104b are coupled to heat spreader 262 for cooling. As previously discussed, semiconductor die 104a is taller than ring stiffener 202 and a cavity 264 is used to accommodate the excess height. Semiconductor die 104b, on the other hand, is short enough that heat spreader 210 would be too far away to make a satisfactory thermal coupling. Heat spreader 262 is formed with a protrusion 268 to lower the bottom surface of the heat spreader above semiconductor die 104b. Protrusion 268 brings the bottom surface of heat spreader 262 down so that the gap between the heat spreader and semiconductor die 104b is appropriate for TIM 266 to thermally connect the two. Protrusion 268 has beveled edges, but the edges could also be vertical as with cavity 264. Likewise, cavity 264 could have beveled edges instead of the pictured vertical edges.

FIG. 5c shows package 270 with heat spreader 272. Package 270 includes the same two semiconductor die 104a and 104b from package 260, with die 104a being taller than ring stiffener 202 and die 104b being shorter. Heat spreader 272 is stamped or otherwise bent, shaped, or formed to include areas 274 and 280 of different heights compared to the rest of the heat spreader that is approximately even with the top of ring stiffener 202. Area 274 is stamped from the top to lower the bottom surface toward semiconductor die 104b. Because heat spreader 272 begins with a uniform thickness and no material is removed in the stamping process, the thickness of the heat spreader within area 274 remains approximately equal to the thickness around area 274. A concave surface 276 is formed on top of heat spreader 272, and a convex surface 278 is formed on the bottom of the heat spreader by area 274 being moved downward.

Likewise, area 280 is stamped from the bottom to raise the surface of heat spreader 272 and form a convex surface 282 on top and a concave surface 284 on the bottom. Stamping is performed prior to installing heat spreader 272 onto package 270. Stamping bends the metal of heat spreader 272 into the illustrated shape or other suitable shapes. Any number and height of semiconductor die, semiconductor packages, or other suitable devices can make thermal contact with a heat spreader via any of the methods disclosed in FIGS. 5a-5c.

Figure 6A:
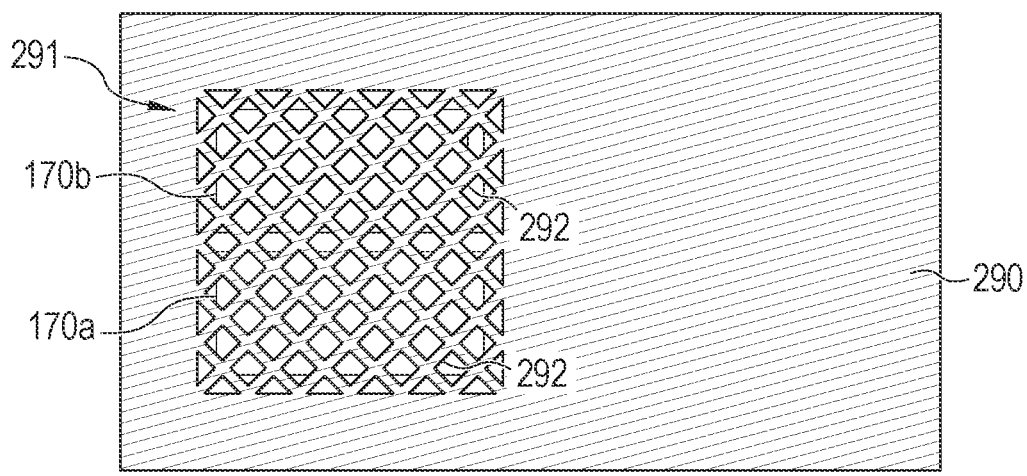
FIGS. 6a-6c illustrate embodiments using mesh openings instead of a singular window.
Figure 6B:
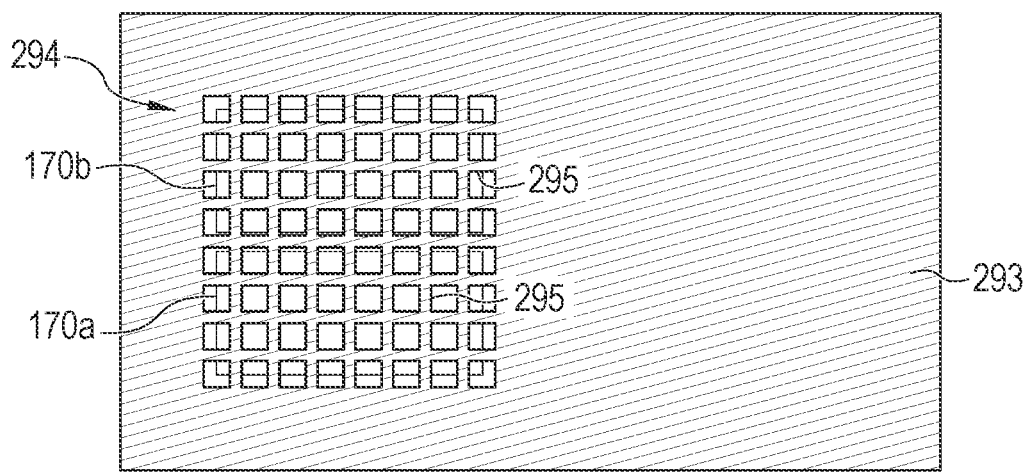
Figure 6C:
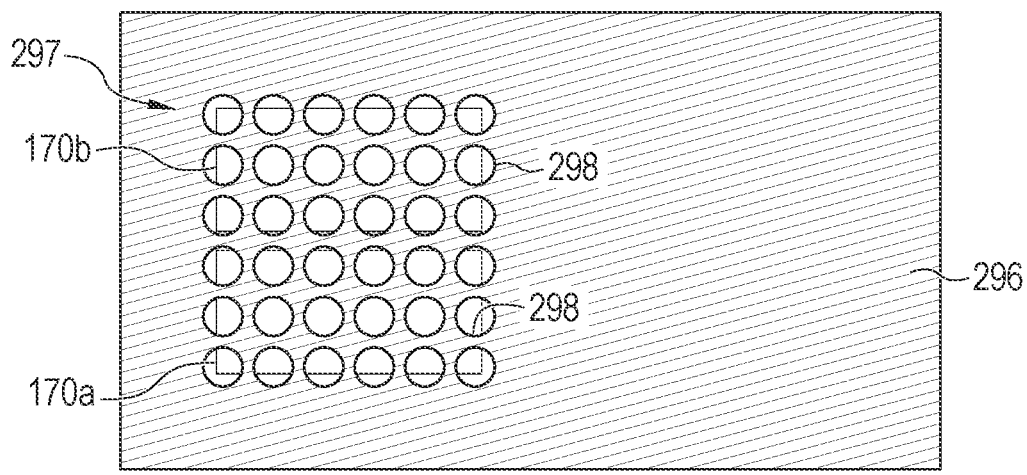

FIGS. 6a-6c illustrate various embodiments where a mesh is formed through a heat spreader instead of a window. The mesh includes a plurality of smaller openings or holes formed through the heat spreader instead of one larger window. In FIG. 6a, heat spreader 290 includes a mesh 291 formed over subpackages 170a and 170b. Mesh 291 includes a plurality of diamond shaped openings 292. Heat spreader 293 in FIG. 6b includes a mesh 294 comprising a plurality of square openings 295. Heat spreader 296 in FIG. 6c includes a mesh 297 with a plurality of circular openings 298. Openings 292, 295, and 298 can be formed by mechanical drilling, mechanical punching, laser cutting, or another suitable process. Any shape of opening can be used to form a mesh. Forming a mesh over subpackages 170a and 170b helps physically protect the tops of the subpackages from external contact while still allowing thermal convection out of the package. The heat spreader material remaining between the mesh holes provides physical protection while the mesh holes allow thermal convection out of the package.

Figure 7A:
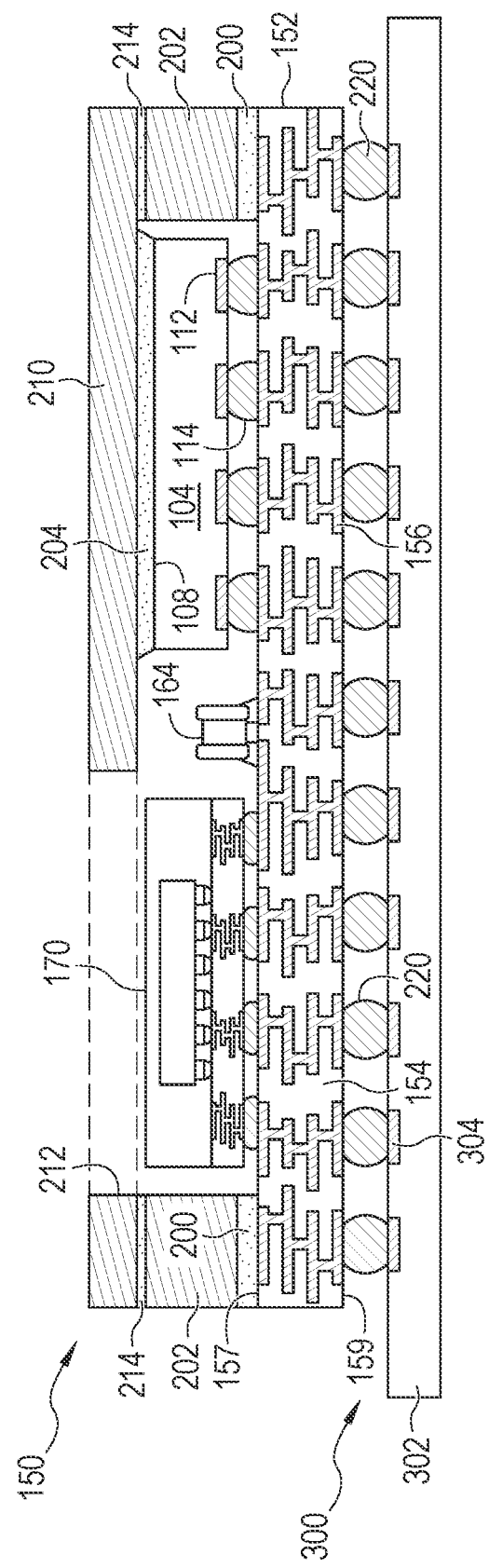
FIGS. 7a and 7b illustrate integrating the packages into an electronic device.
Figure 7B:
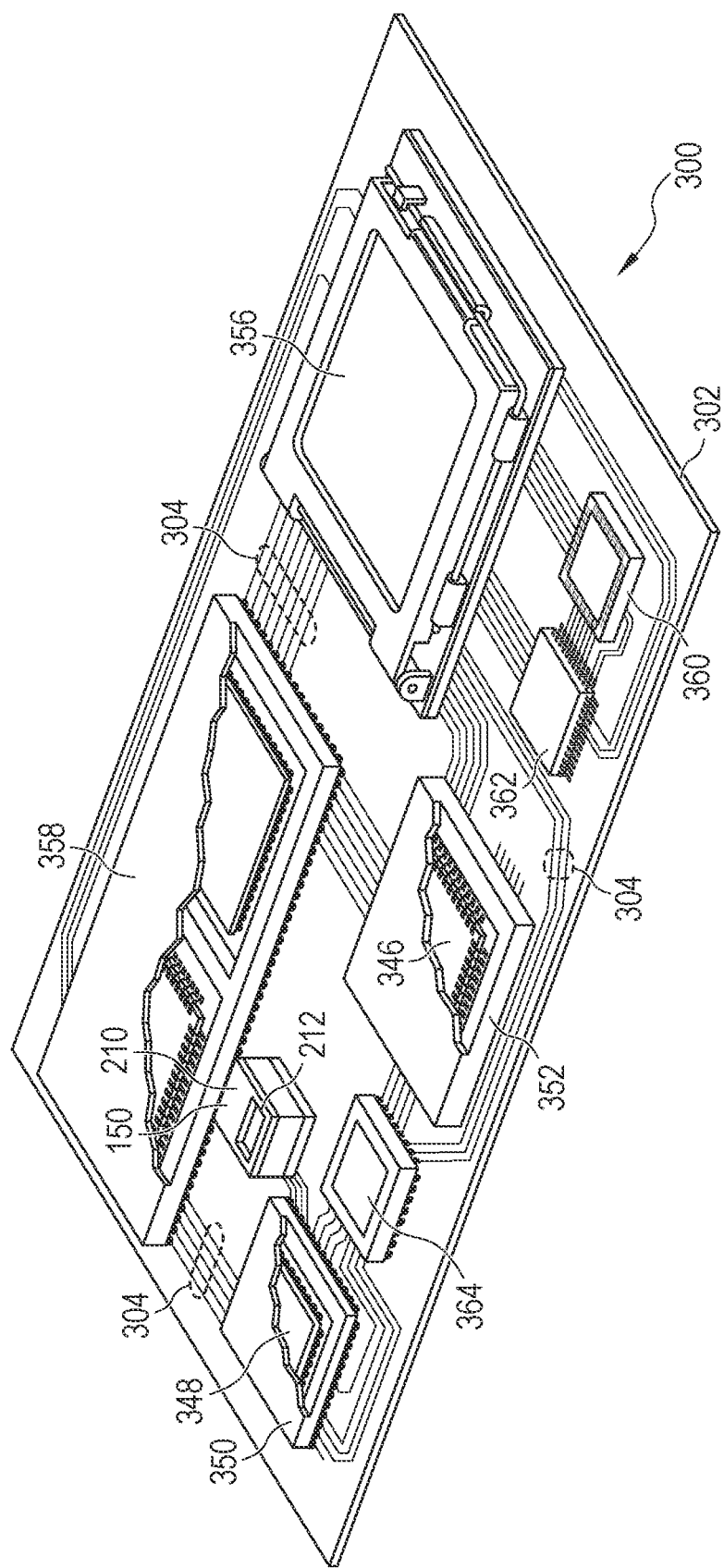

FIGS. 7a and 7b illustrate incorporating the above-described semiconductor packages, e.g., package 150, into an electronic device 300. FIG. 7a illustrates a partial cross-section of package 150 mounted onto a printed circuit board (PCB) or other substrate 302 as part of electronic device 300. Bumps 220 are reflowed onto conductive layer 304 of PCB 302 to physically attach and electrically connect package 150 to the PCB. In other embodiments, thermocompression or other suitable attachment and connection methods are used. In some embodiments, an adhesive or underfill layer is used between package 150 and PCB 302. Semiconductor die 104, discrete component 168, and subpackage 170 are electrically coupled to each other and conductive layer 304 through substrate 152 and bumps 220.

FIG. 7b illustrates electronic device 300 including PCB 302 with a plurality of semiconductor packages mounted on a surface of the PCB, including package 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 150. Conductive traces 304 electrically couple the various packages and components disposed on PCB 302 to package 150, giving use of the components within package 150 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a first semiconductor die over the substrate;
   disposing a subpackage over the substrate;
   disposing a stiffener over the substrate around the first semiconductor die and subpackage; and
   disposing a heat spreader over the stiffener, wherein the heat spreader is thermally coupled to the first semiconductor die, and wherein the heat spreader includes an opening over the subpackage.

2. The method of claim 1, further including forming a plurality of openings in the heat spreader over the subpackage.

3. The method of claim 1, wherein the subpackage is disposed completely within a footprint of the opening.

4. The method of claim 1, further including disposing a second semiconductor die over the substrate and thermally coupled to the heat spreader, wherein a height of the first semiconductor die is different from a height of the second semiconductor die.

5. The method of claim 1, further including forming a cavity or protrusion on the heat spreader over the first semiconductor die.

6. The method of claim 1, wherein the stiffener includes a compartment stiffener.

7. A method of making a semiconductor device, comprising:
   providing a substrate;
   disposing a stiffener over a first surface of the substrate;
   disposing a first electrical component over the first surface of the substrate; and
   disposing a heat spreader over the stiffener with an opening of the heat spreader disposed over the first electrical component, wherein a footprint of the opening is larger than a footprint of the first electrical component.

8. The method of claim 7, further including a second electrical component disposed over a second surface of the substrate opposite the first surface.

9. The method of claim 7, further including disposing a second electrical component over the substrate and thermally coupled to the heat spreader.

10. The method of claim 7, wherein the stiffener includes a compartment stiffener.

11. The method of claim 7, further including a protrusion or cavity formed in the heat spreader.

12. A semiconductor device, comprising:
    a substrate;
    a first semiconductor die disposed over the substrate;
    a subpackage disposed over the substrate;
    a stiffener disposed over the substrate around the first semiconductor die and subpackage; and
    a heat spreader disposed over the stiffener, wherein the heat spreader is thermally coupled to the first semiconductor die, and wherein the heat spreader includes an opening over the subpackage.

13. The semiconductor device of claim 12, further including a plurality of openings formed in the heat spreader over the subpackage.

14. The semiconductor device of claim 12, wherein the subpackage is disposed completely within a footprint of the opening.

15. The semiconductor device of claim 12, further including a second semiconductor die disposed over the substrate and thermally coupled to the heat spreader, wherein a height of the first semiconductor die is different from a height of the second semiconductor die.

16. The semiconductor device of claim 12, wherein the heat spreader includes a cavity or protrusion.

17. The semiconductor device of claim 12, wherein the stiffener includes a compartment stiffener.

18. A semiconductor device, comprising:
    a substrate;
    a first electrical component disposed over the substrate;
    a stiffener disposed over the substrate; and
    a heat spreader disposed over the stiffener, wherein the heat spreader includes an opening disposed over the first electrical component, and wherein a footprint of the opening is larger than a footprint of the first electrical component.

19. The semiconductor device of claim 18, further including a second electrical component disposed over the substrate and thermally coupled to the heat spreader.

20. The semiconductor device of claim 18, wherein the stiffener includes a compartment stiffener.

21. The semiconductor device of claim 18, further including a protrusion or cavity formed in the heat spreader.

* * * * *